(12) United States Patent
Kim et al.

(10) Patent No.: US 9,461,003 B1
(45) Date of Patent: Oct. 4, 2016

(54) SEMICONDUCTOR DEVICES HAVING SHIELDING PATTERN

(71) Applicant: SAMSUNG ELECTRONICS CO., LTD., Suwon-Si, Gyeonggi-Do (KR)

(72) Inventors: Jimyung Kim, Hwaseong-Si (KR);
Yigwon Kim, Hwaseong-Si (KR);
Suhyun Kim, Hwaseong-Si (KR);
Kwangsub Yoon, Yongin-Si (KR);
Bumjoon Youn, Suwon-Si (KR);
Narak Choi, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/995,467

(22) Filed: Jan. 14, 2016

(30) Foreign Application Priority Data

May 13, 2015 (KR) .................. 10-2015-0066683

(51) Int. Cl.
*H01L 27/146* (2006.01)
*H01L 23/552* (2006.01)
*H01L 23/58* (2006.01)
*H01L 23/544* (2006.01)

(52) U.S. Cl.
CPC .......... *H01L 23/552* (2013.01); *H01L 23/544* (2013.01); *H01L 23/585* (2013.01); *H01L 2223/54426* (2013.01)

(58) Field of Classification Search
CPC ................ H01L 27/14623; H01L 27/14629
USPC .................................. 257/431–448
See application file for complete search history.

(56) References Cited

U.S. PATENT DOCUMENTS

| 5,647,152 | A | 7/1997 | Miura |
| 8,252,491 | B2 | 8/2012 | Van Haren et al. |
| 8,803,320 | B2 * | 8/2014 | Chen .................. H01L 23/5225 257/758 |
| 2006/0117293 | A1 | 6/2006 | Smith et al. |
| 2011/0024924 | A1 | 2/2011 | Shih et al. |
| 2013/0155406 | A1 | 6/2013 | Den Boef |

OTHER PUBLICATIONS http://en.wikipedia.org/wiki/Faraday_cage.
Ulrich, R. et al., "Variable Metal Mesh Coupler for Far Infrared Lasers," Nov. 1970, vol. 9, No. 11, Applied Optics, pp. 2511-2516.

* cited by examiner

*Primary Examiner* — Cuong Q Nguyen
(74) *Attorney, Agent, or Firm* — Volentine & Whitt, PLLC

(57) ABSTRACT

A semiconductor device includes a circuit pattern on a substrate, a shielding pattern on the circuit pattern and constituted by a plurality of parallel bars, and lower overlay marking on the shielding pattern and constituted by a plurality of parallel bars which define parallel slits between the bars. The pitch of the bars of the shielding pattern is smaller than the pitch of the bars of the lower overlay marking.

20 Claims, 17 Drawing Sheets

1

SEMICONDUCTOR DEVICES HAVING SHIELDING PATTERN

PRIORITY STATEMENT

This application claims priority under 35 U.S.C. §119 to Korean Patent Application No. 10-2015-0066683 filed on May 13, 2015, the disclosure of which is hereby incorporated by reference in its entirety.

BACKGROUND

1. Field

The inventive concepts relate to the manufacturing of semiconductor devices having layers of patterns. In particular, the inventive concepts relate to a semiconductor device having layers of patterns and overlay marking for use in determining a degree to which the layers of patterns have been properly formed relative to one another, and to the manufacturing of such a semiconductor device.

2. Description of the Related Art

The manufacturing of semiconductor devices has become very sophisticated to meet a demand for increasing the degree of integration of the semiconductor devices. Processes in the manufacturing of semiconductor devices which have become increasingly important and sophisticated include a photolithography process used to form fine patterns of a semiconductor device, an alignment process of aligning a substrate with apparatus used to perform the photolithography process, and an overlay inspection process of inspecting the relative positioning of layers of patterns formed by photolithography. The overlay inspection process may be carried out using overlay marking formed on the substrate with the photolithography equipment after a pattern of the semiconductor device has been formed. The overlay marking may comprise a diffraction grating. Light shown onto the substrate through the overlay marking may be diffracted by the diffraction grating of the overlay marking, captured, and analyzed. The overlay marking may extend in a scribe lane bordering a chip region in which the circuit patterns has been formed so that the light diffracted by the overlay pattern and captured for analysis is not adversely affected by the circuit pattern. However, a step difference between the chip region and the scribe lane may render the overlay inspection process inaccurate.

SUMMARY

In accordance with an aspect of the inventive concept, there is provided a semiconductor device including a substrate and a circuit pattern on the substrate, a shielding pattern extending over the circuit pattern and comprising parallel bars of material such that the shielding pattern also defines a plurality of openings between the bars, and lower overlay marking disposed on the shielding pattern and comprising parallel bars of material, and in which the lower overlay marking has a plurality of slits defined by and between the bars thereof, and the pitch of the bars of the shielding pattern is smaller than the pitch of the bars of the lower overlay marking.

In accordance with another aspect of the inventive concept, there is provided a semiconductor device including a substrate and a circuit pattern on the substrate, a shielding pattern disposed on the circuit pattern and comprising a plurality of parallel bars of material, and lower overlay marking disposed on the shielding pattern and comprising a plurality of parallel bars of material, and in which the lower overlay marking has a plurality of slits defined by and between the bars thereof, and some of the bars of the shielding pattern overlap the slits of the lower overlay marking as viewed in plan.

In accordance with another aspect of the inventive concept, there is provided a semiconductor device including a substrate and a circuit pattern comprising electrically conductive features on the substrate, a light shielding pattern comprising bars of opaque and electrically inactive material in the device, the bars extending over the circuit pattern, and overlay marking dedicated for use in an overlay inspection process. The overlay marking consists of bars of electrically inactive material in the device, and has a plurality of slits defined by and between the bars thereof. Also, the light shielding pattern is interposed between the overlay marking and the circuit pattern.

BRIEF DESCRIPTION OF THE DRAWINGS

The foregoing and other features as well as advantages of semiconductor devices and their method of manufacture according to the inventive concepts will be apparent from the more particular description of examples of the semiconductor devices and method, as illustrated in the accompanying drawings in which like reference characters denote the same parts throughout the different views. The drawings are not necessarily to scale, emphasis instead being placed upon illustrating the principles of the inventive concepts. In the drawings.

DETAILED DESCRIPTION

Figure 1A:
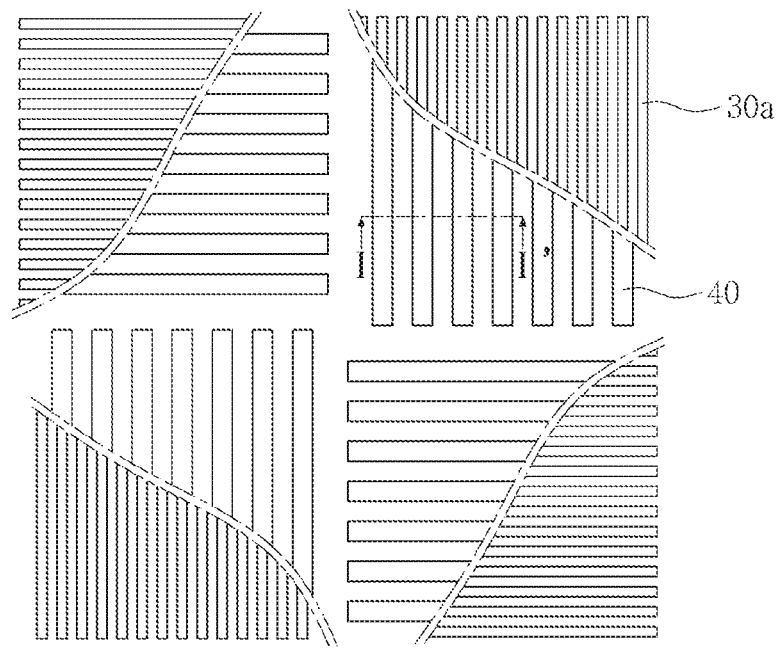
FIGS. 1A, 1B and 1C are diagrams of the layouts of a shielding pattern and lower overlay marking of various examples of semiconductor devices according to the inventive concepts.

Examples of the inventive concepts will now be described more fully with reference to the accompanying drawings to clarify aspects, features, and advantages of the inventive concepts. The inventive concepts may, however, be exemplified in many different ways and should not be construed as being limited to the examples disclosed herein. Rather, these examples are provided so that this disclosure will be through and complete, and will fully convey the inventive concepts to those of ordinary skill in the art.

The terminology used herein is for the purpose of describing particular examples only and is not intended to be limiting of the present inventive concepts. As used herein, the singular forms "a," "an," and "the" are intended to comprise the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

The term "extending" will generally refer to a longitudinal direction of an element or feature especially in the case of a linear element or feature such as a bar or slit. The term "overlap" will generally be understood as referring to a case in which all or only part of one pattern, element, feature or the like lies over or beneath another pattern, element, feature or the like as viewed in plan. The term "overlap" may thus be used to refer to a general vertical juxtaposition of patterns, elements, features or the like. The term "vertically aligned" will generally be understood as referring to a case in which the geometrical center of one element, feature, or the like, e.g., the longitudinal axis of a linear feature, is vertically aligned with that of another element, feature, or the like. The term "pitch" will be used with reference to a series of substantially uniform elements or features spaced apart by regular intervals and will generally understood as the distance between each feature or element and the next closest feature or element in a particular direction as measured between corresponding places (e.g., corresponding sides) of the elements or features. The term "opaque" will be understood as being used with reference to a particular type or wavelength/range of wavelengths of light.

When one element(s) is/are referred to as "connected" or "coupled" to other element(s), this may indicate directly connected or coupled to the elements(s), or intervening elements may be present. On the other hand, when one element referred to as "directly connected (directly connected to)" or "directly coupled (directly coupled to)" other element(s), there are no intervening element(s). Throughout the entire specification, the same reference numbers refer to the same components. The term "and/or" comprises each and all combinations of one or more of the items mentioned.

Spatially relative terms, such as "below," "beneath," "lower," "above," "upper," and the like, may be used herein to easily describe the correlation between one device or elements and another device or other elements as illustrated in the figures. The spatially relative terms should be understood as the terms that comprise different orientations of the device in additional usage or operation of the orientations illustrated in figures. For example, when the device illustrated in the figures is turned over, the device described as disposed "below" or "beneath" another device may be disposed "above" the other device. Accordingly, the exemplary term "below" or "beneath" may comprise orientations of both below and above. The device may be oriented at other orientations, and the spatially relative terms used herein may be interpreted accordingly.

Examples are described herein with reference to cross-sectional illustrations that are schematic illustrations of idealized examples (and intermediate structures). As such, variations from the shapes of the illustrations as a result, for example, of manufacturing techniques and/or tolerances, are to be expected. Thus, examples should not be construed as limited to the particular shapes of regions illustrated herein but are to comprise deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Figure 1B:
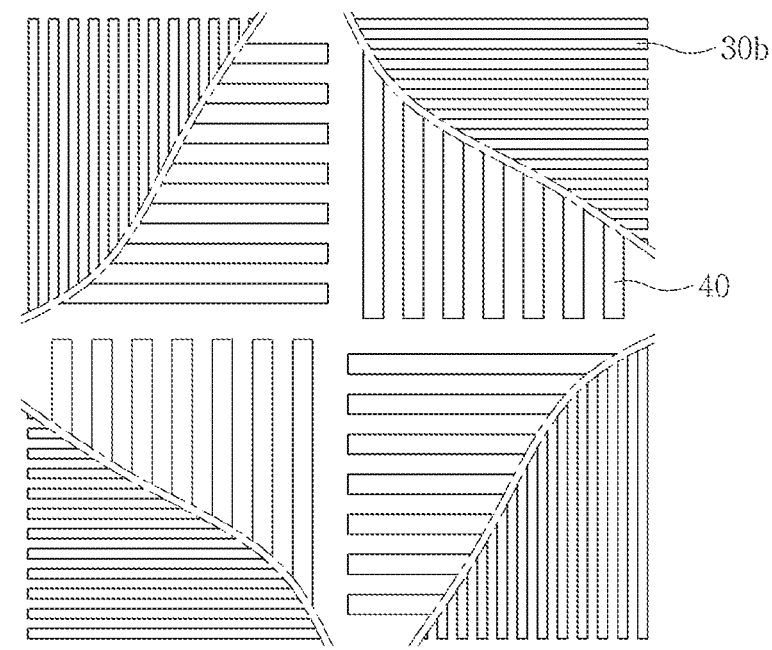
Figure 1C:
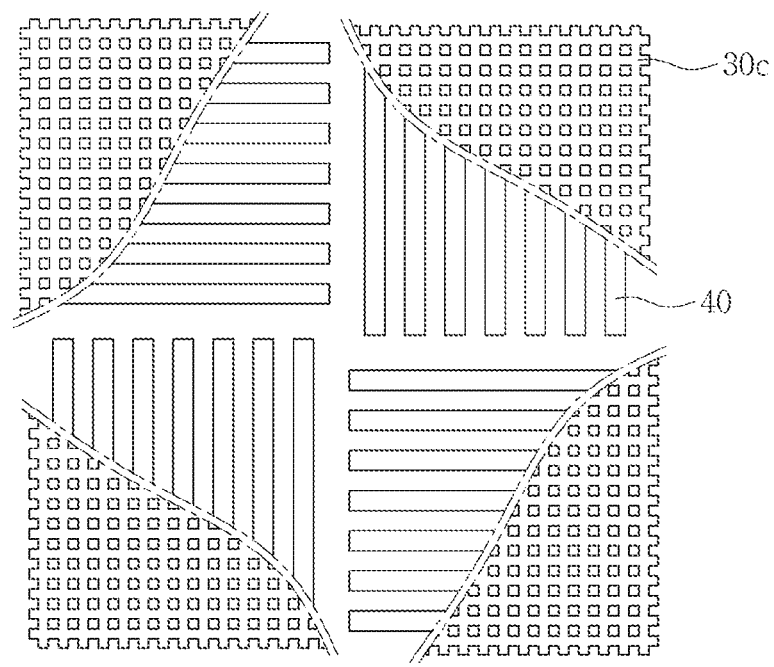

FIGS. 1A to 1C illustrate layouts of a shielding pattern and lower overlay marking of examples of semiconductor devices according to an aspect of the inventive concepts.

Referring to FIG. 1A, each of the shielding pattern 30a and lower overlay marking 40 comprise a plurality of sets of parallel bars and slits extending in four directions within four quadrants of a square region, respectively. The bars are oriented such that each of the shielding pattern 30a and lower overlay marking 40 has the shape of a pinwheel. That is, the orientation of each of the sets of parallel bars of the lower shielding pattern 30a (and lower overlay marking 40) are rotated by an angular increment of 90 degrees relative to the orientation of the set of parallel bars adjacent thereto in a clockwise (or counterclockwise) direction in the square region. The shielding pattern 30a may be vertically juxtaposed with the lower overlay marking 40, and may be a layer located at a level within the device lower than that at which the lower overlay marking 40 is located. Also, the bars of the shielding pattern 30a and the bars of the lower overlay marking 40 in each quadrant may extend parallel to each other. In addition, the bars and slits of the shielding pattern 30a may be narrower than those of the lower overlay marking 40. For example, the pitch of the bars of the shielding pattern 30a may be 1/n times the pitch of the bars of the lower overlay marking 40 (where, n is a positive integer).

In the example shown in FIG. 1B, each of the shielding pattern 30b and lower overlay marking 40 also comprise a plurality of sets of parallel bars and slits extending in four directions within four quadrants of a square region, respectively. Likewise, the bars are oriented such that each of the shielding pattern 30b and lower overlay marking 40 has the form of a pinwheel. Furthermore, the pitch of the bars of the shielding pattern 30b may also be smaller than that of the bars of the lower overlay marking 40. In this example, the bars of the shielding pattern 30b and the bars of the lower overlay marking 40 extend orthogonally to each other within each quadrant.

In the example shown in FIG. 1C, the shielding pattern 30c comprises a plurality of orthogonal bars forming a grid or lattice within each of the four quadrants of a square region. The bars constituting the shielding pattern 30c may have the pitch in each quadrant, in a direction parallel to the bars of the lower overlay marking 40 in the same quadrant, which is smaller than that of the bars of the lower overlay marking 40.

Thus, in these examples shown in and described with reference to FIGS. 1A to 1C, each set of bars constituting the shielding pattern in a particular quadrant overlap, i.e., are vertically juxtaposed with, a respective set of bars of the lower overlay marking 40.

FIGS. 2A to 4B illustrate layouts of the overlapping shielding pattern and lower overlay marking of various examples of semiconductor devices according to the inventive concept, in one quadrant.

Figure 2A:
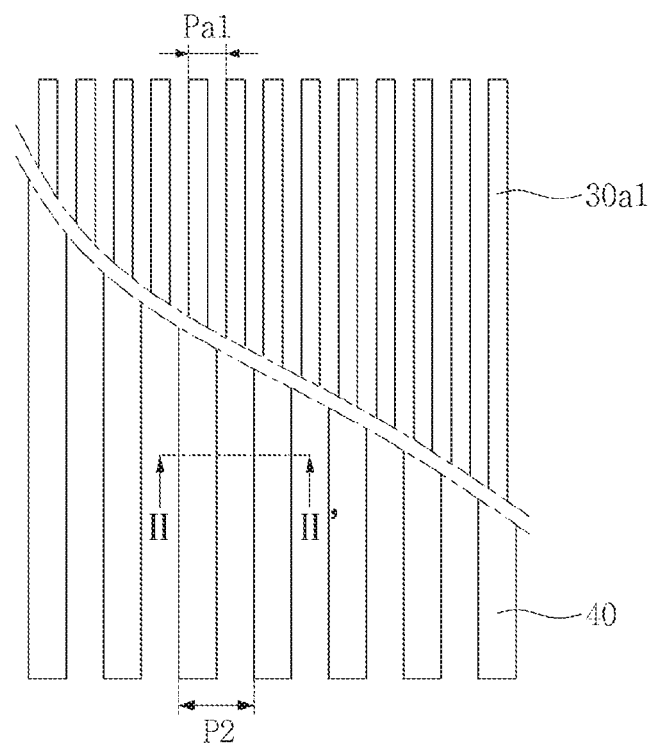
FIG. 2A is a diagram of one version of the layout of the overlapping shielding pattern and lower overlay marking in a chip region of the semiconductor device of FIG. 1A according to the inventive concepts.
Figure 2B:
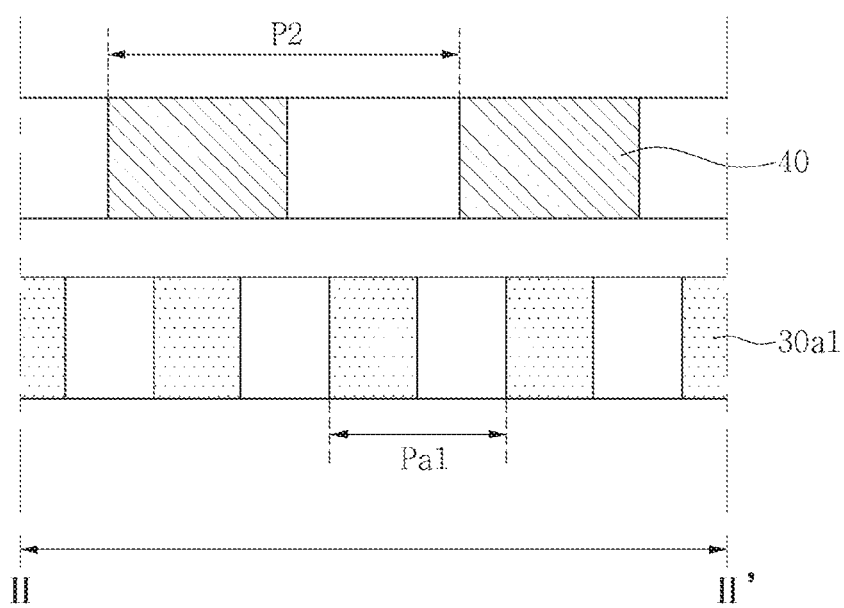
FIG. 2B is a sectional view of the overlapping shielding pattern and lower overlay marking as taken along line II-II' in FIG. 2A.

Referring to FIGS. 2A and 2B, shielding pattern 30a1 of this example comprises a plurality of bars parallel to bars of the lower overlay marking 40, and the pitch Pa1 of the bars of the shielding pattern 30a1 may be smaller than the pitch P2 of the bars of the lower overlay marking 40. For example, the pitch Pa1 of the bars of the shielding pattern 30a1 may be ½ times the pitch P2 of the bars of the lower overlay marking 40. Also, the bars of the shielding pattern 30a1 may be arranged relative to the bars and the slits of the lower overlay marking 40 such that each of the bars of the shielding pattern 30a1 may fully overlap a respective one of the bars or slits of the lower overlay marking 40. Accordingly, the shielding pattern 30a1 and the lower overlay marking 40 may each be symmetrical about the same vertical plane. That is, distances from a bar of shielding pattern 30a1 to the bars of the lower overlay marking 40 located nearest to left and right sides of the bar of shielding pattern 30a1 may be the same. Likewise, distances from a bar of shielding pattern 30a1 to the slits of the lower overlay marking 40 located nearest to the left and right sides of the bar of shielding pattern 30a1 may be the same.

Figure 3A:
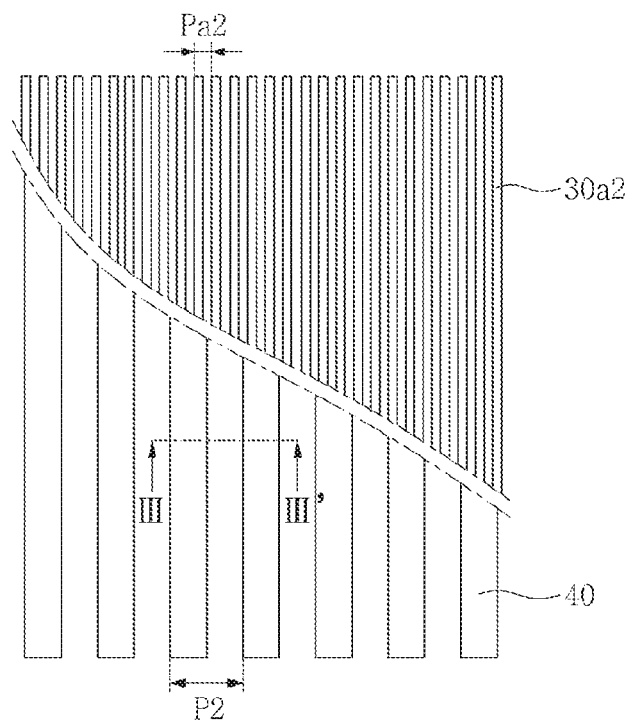
FIG. 3A is a diagram of another version of the layout of the overlapping shielding pattern and lower overlay marking in a chip region of the semiconductor device of FIG. 1A according to the inventive concepts.
Figure 3B:
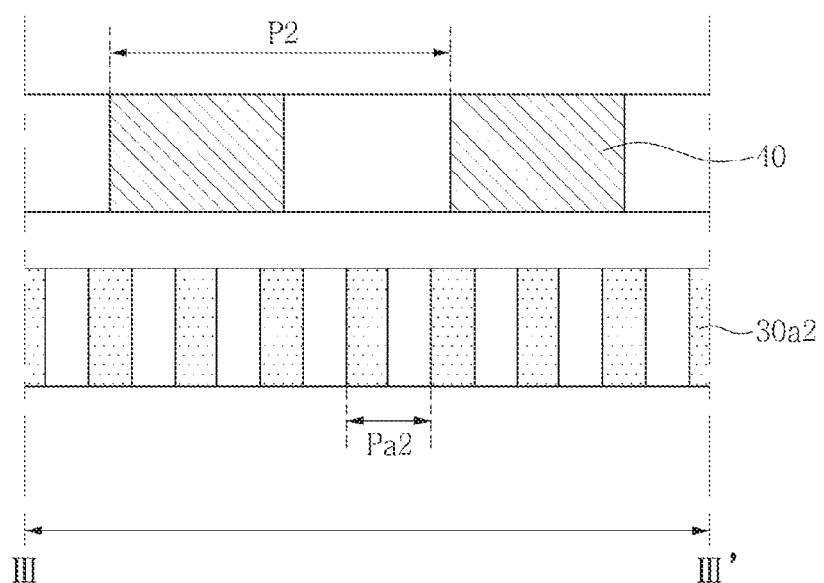
FIG. 3B is a sectional view of the overlapping shielding pattern and lower overlay marking as taken along line III-III' in FIG. 3A.

Referring to FIGS. 3A and 3B, shielding pattern 30a2 of this example comprises a plurality of bars parallel to the bars of the lower overlay marking 40, and the pitch Pa2 of the bars of the shielding pattern 30a2 may be ¼ times the pitch P2 of the bars of the lower overlay marking 40. Only one bar each of the shielding pattern 30a2 may be vertically aligned with each of the bars of the lower overlay marking 40, the slits of the lower overlay marking 40, and sidewall surfaces of the bars of the lower overlay marking 40. The bars of the shielding pattern 30a2 and the bars of the lower overlay marking 40 may each be symmetrical about the same vertical plane. Accordingly, distances from each bar of the shielding pattern 30a2 vertically aligned with the center of a slit of the lower overlay marking 40 to bars of the lower overlay marking 40 located nearest to left and right sides of the bar of shielding pattern 30a2 may be the same. Likewise, distances from each bar of shielding pattern 30a2 vertically aligned with the center of a bar of lower overlay marking 40 to slits of the lower overlay marking 40 located nearest to left and right sides of the bar of shielding pattern 30a2 may be the same.

Figure 4A:
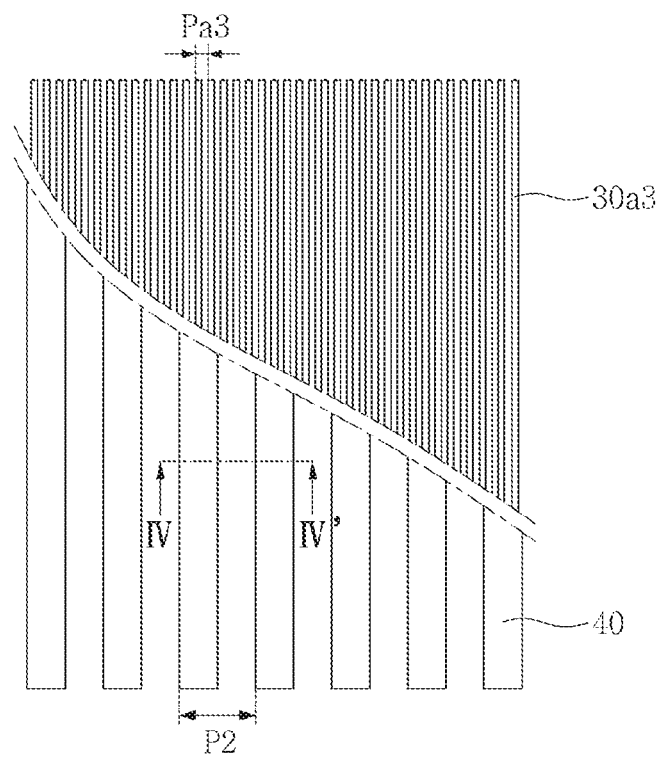
FIG. 4A is a diagram of another version of the layout of the overlapping shielding pattern and lower overlay marking in a chip region of the semiconductor device of FIG. 1A according to the inventive concepts.
Figure 4B:
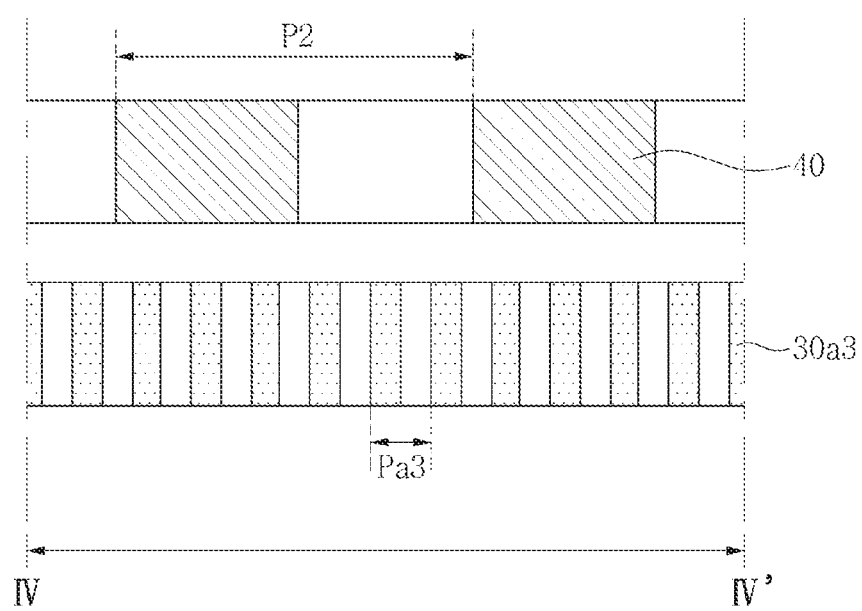
FIG. 4B is a sectional view of the overlapping shielding pattern and lower overlay marking as taken along line IV-IV' in FIG. 4A.

Referring to FIGS. 4A and 4B, shielding pattern 30a3 of this example comprises a plurality of bars parallel to the bars of the lower overlay marking 40, and the pitch Pa3 of the bars of the shielding pattern 30a3 may be ⅙ times the pitch P2 of the bars of the lower overlay marking 40. Three bars of the shielding pattern 30a3 may completely overlap each respective bar and slit of the lower overlay marking 40. The bars of the shielding pattern 30a3 and the bars of the lower overlay marking 40 may also each be symmetrical about the same vertical plane. That is, distances from each bar of the shielding pattern 30a3 vertically aligned with the center of a slit of the lower overlay marking 40 to bars of the lower overlay marking 40 located nearest to left and right sides of the bar of the shielding pattern 30a3 may be the same. Likewise, distances from a bar of the shielding pattern 30a3 vertically aligned with the center of a bar of the lower overlay marking 40 to slits of the lower overlay marking 40 located nearest to left and right sides of the bar of the shielding pattern 30a3 may be the same.

Therefore, in all of the examples of FIGS. 2A-4B, it can be seen that respective ones of the bars of the shielding pattern 30a1, 30a2, and 30a3 are vertically aligned with all of the bars and/or slits of the lower overlay marking 40. In fact, in all of the examples of FIGS. 2A-4B, respective ones of the bars of the shielding pattern 30a1, 30a2, and 30a3 are vertically aligned with all of the bars and slits of the lower overlay marking 40.

FIGS. 5A-6C illustrate layouts of the overlapping shielding pattern and lower overlay marking of examples of semiconductor devices according to the inventive concepts, in one quadrant.

Figure 5A:
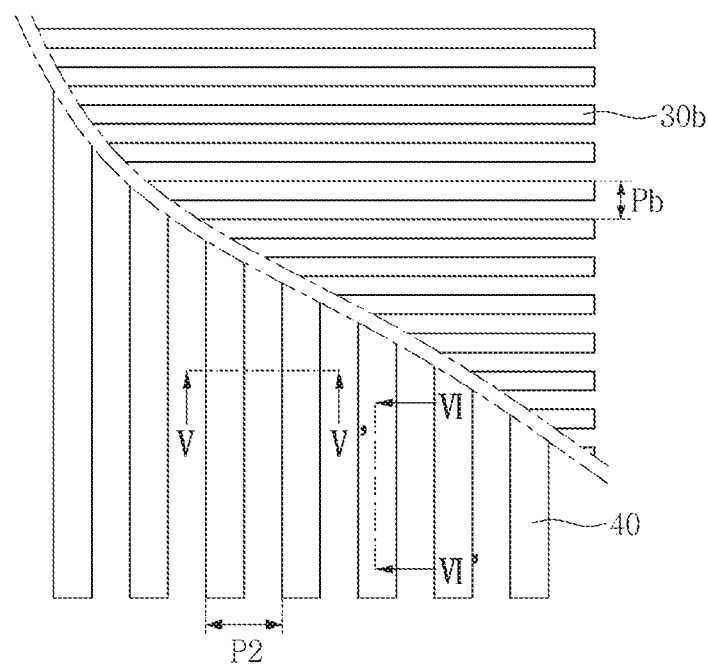
FIG. 5A is a diagram of a version of the layout of the overlapping shielding pattern and lower overlay marking in a chip region of the semiconductor device of FIG. 1B according to the inventive concepts.
Figure 5B:
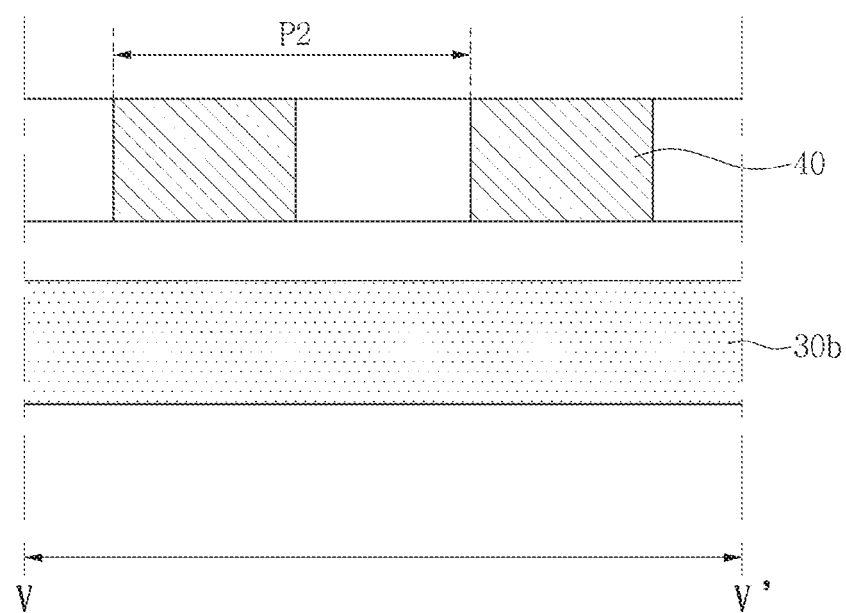
FIG. 5B is a sectional view of the overlapping shielding pattern and lower overlay marking as taken along line V-V' in FIG. 5A.
Figure 5C:
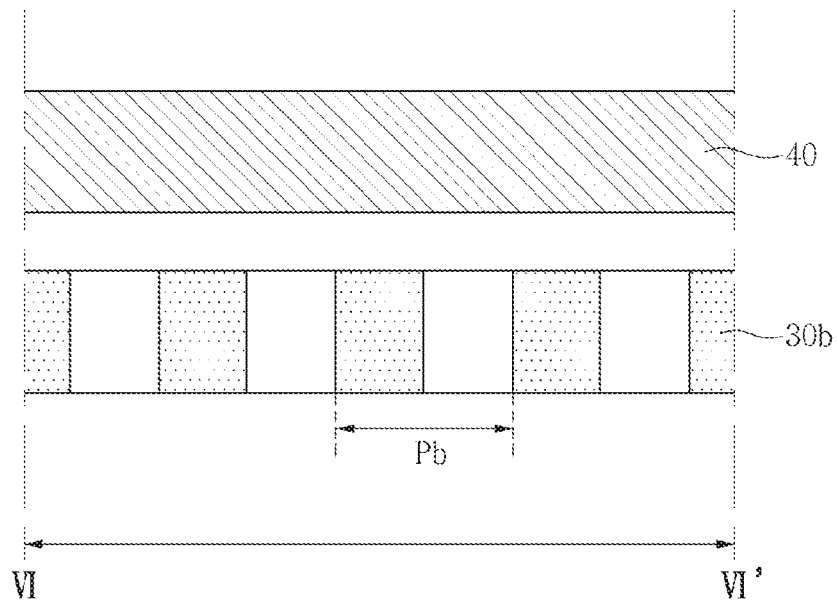
FIG. 5C is a sectional view of the overlapping shielding pattern and lower overlay marking as taken along line VI-VI' in FIG. 5A.

Referring to FIGS. 5A to 5C, shielding pattern 30b of this example comprises a plurality of bars and a plurality of slits extending perpendicular to bars of the lower overlay marking 40. The pitch Pb of the bars of the shielding pattern 30b is equal to or smaller than the pitch P2 of the bars of the lower overlay marking 40.

Figure 6A:
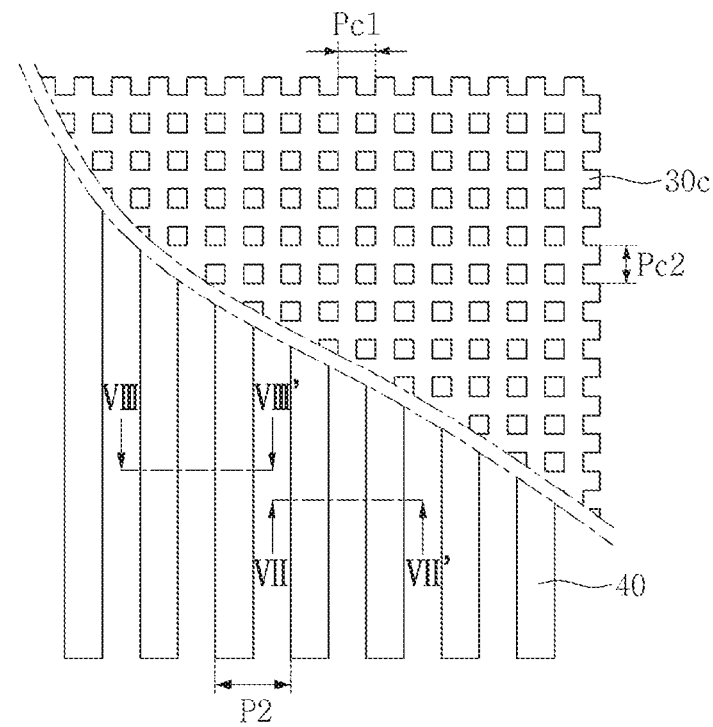
FIG. 6A is a diagram of a version of the layout of the overlapping shielding pattern and lower overlay marking in a chip region of the semiconductor device of FIG. 1C according to the inventive concepts.
Figure 6B:
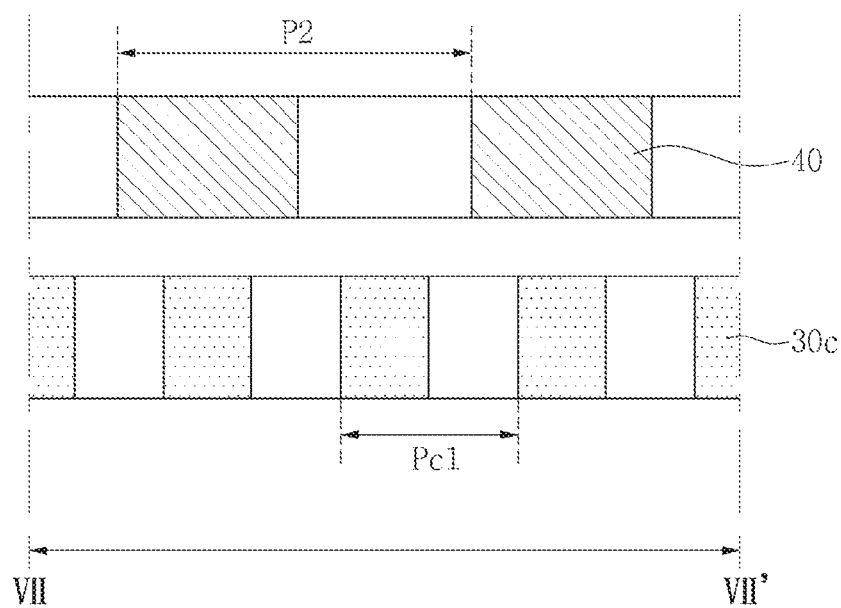
FIG. 6B is a sectional view of the overlapping shielding pattern and lower overlay marking as taken along line VII-VII' in FIG. 6A.
Figure 6C:
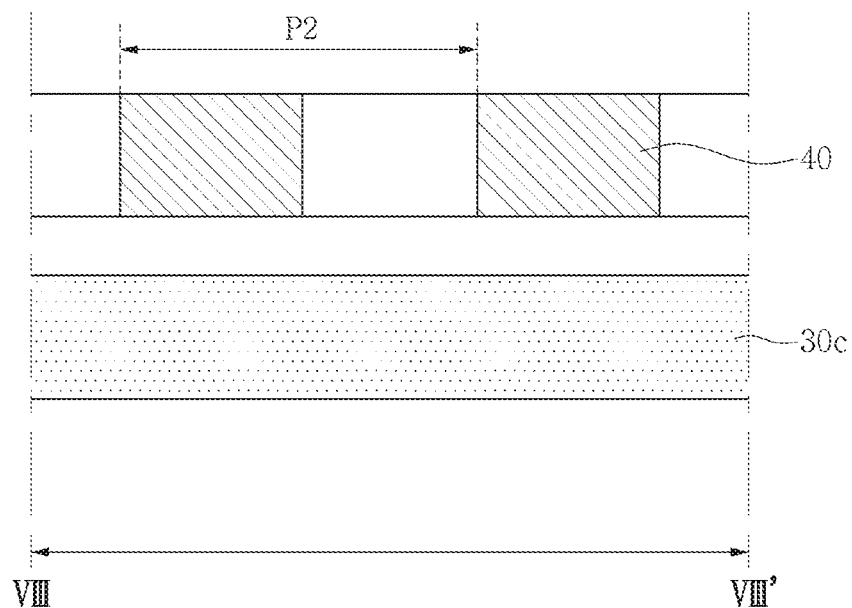
FIG. 6C is a sectional view of the overlapping shielding pattern and lower overlay marking as taken along line VIII-VIII' in FIG. 6A.

Referring to FIGS. 6A to 6C, shielding pattern 30c of this example comprises sets of bars which extend perpendicular to and cross each other, and one of which sets is constituted by bars extending parallel to the bars of the lower overlay marking 40. The pitch Pc1 of one set of the bars and the pitch Pc2 of the other set of bars of shielding pattern 30c may be smaller than the pitch P2 of the bars of the lower overlay marking 40. Although the pitches Pc1 and Pc2 are illustrated as identical, they may be different from each other. The pitch Pct of the bars of the shielding pattern 30c which extend parallel to the bars of the overlay marking 40 may be smaller than the pitch P2 of the bars of the lower overlay marking 40.

A duty cycle of the shielding pattern 30a, 30b, and 30c shown in FIGS. 3A to 6C may be 50% over each pitch of the bars of the shielding pattern. For example, the sum of the widths of the bars is preferably the same as the sum of the widths of the slits, given that the spacing between the bars is regular, in the direction perpendicular to the bars of the overlay marking 40. In this respect, the bars and the slits may have the same widths.

FIGS. 7A-8B illustrate layouts of an overlapping shielding pattern and lower overlay marking of various examples of semiconductor devices according to the inventive concepts.

Figure 7A:
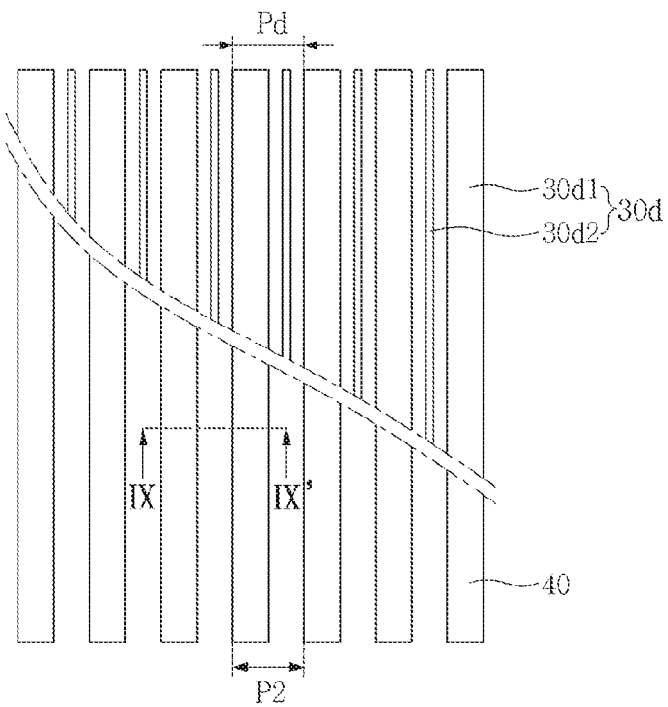
FIG. 7A is a diagram of another example of the layout of the overlapping shielding pattern and lower overlay marking in at least one quadrant of a chip region of a semiconductor device according to the inventive concepts.
Figure 7B:
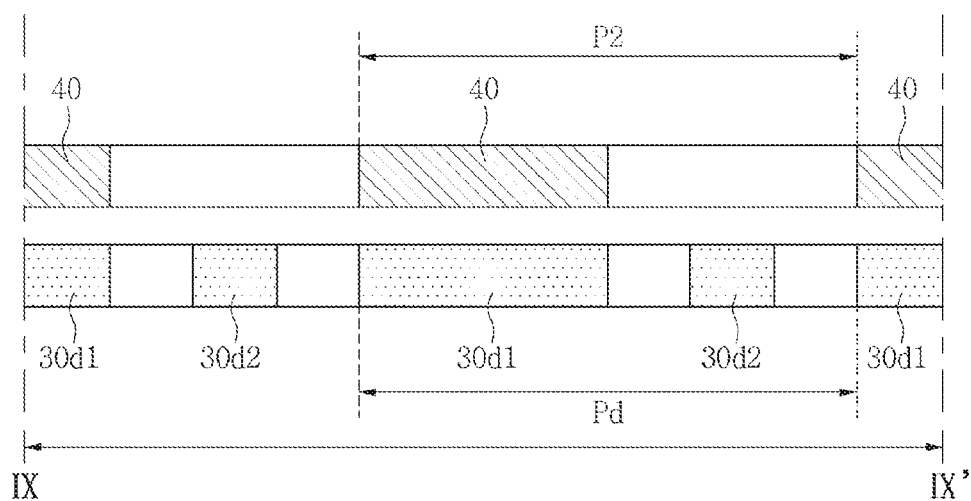
FIG. 7B is a sectional view of the overlapping shielding pattern and lower overlay marking as taken along line IX-IX' in FIG. 7A.

Referring to FIGS. 7A and 7B, shielding pattern 30d of this example comprises first bars 30d1 overlapping bars of lower overlay marking 40, respectively, and second bars 30d2 overlapping slits of the bars of the lower overlay marking 40, respectively. The first bars 30d1 and the second bars 30d2 may be alternately arranged. In other words, one second bar 30d2 may be interposed between two first bars 30d1 of each respective pair of the first bars 30d1. The first bars 30d1 of the shielding pattern 30d may have the same widths as the bars of the lower overlay marking 40. Therefore, for example, sidewall surfaces of the first bars 30d1 of the shielding pattern 30d and sidewall surfaces of the bars of the lower overlay marking 40 may be vertically aligned. The first bars 30d1 may be wider than the second bars 30d2. The second bars 30d2 and the bars of the lower overlay marking 40 may each be symmetrical with respect to the same vertical plane. For example, the second bars 30d2 may be vertically aligned with the slits of the lower overlay marking 40. The pitch Pd of the first bars 30d1 may be the same as the pitch P2 of the bars of the lower overlay marking 40. Slits between the first bars 30d1 and the second bars 30d2 may be uniform.

Figure 8A:
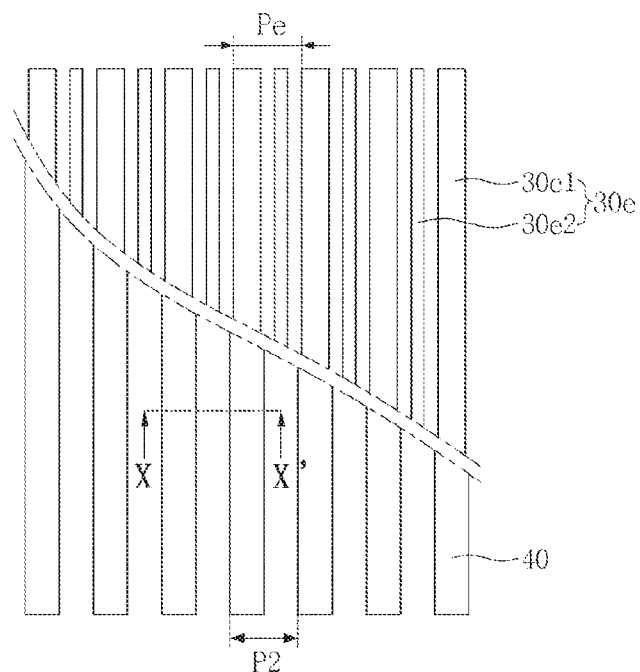
FIG. 8A is a diagram of another example of the layout of the overlapping shielding pattern and lower overlay marking in at least one quadrant of a chip region of a semiconductor device according to the inventive concepts.
Figure 8B:
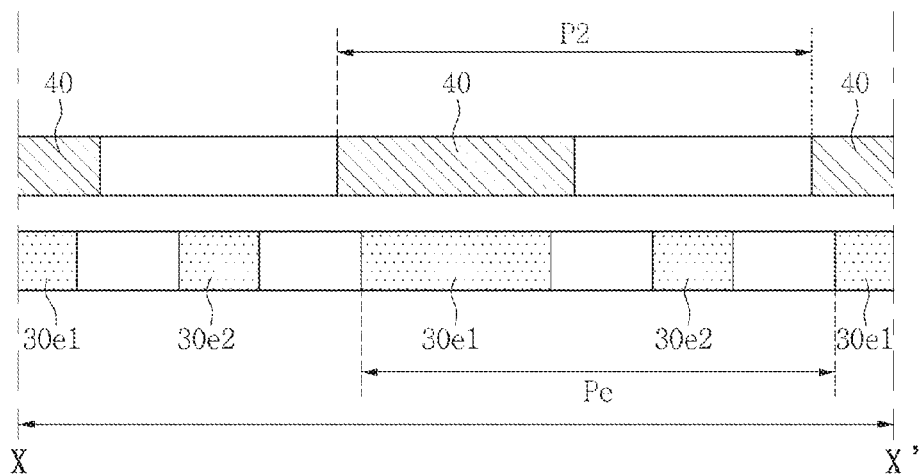
FIG. 8B is a sectional view of the overlapping shielding pattern and lower overlay marking as taken along line X-X' in FIG. 8A.

Referring to FIGS. 8A and 8B, shielding pattern 30e of this example comprises first bars 30e1 overlapping bars of lower overlay marking 40 and second bars 30e2 overlapping slits of the bars of the lower overlay marking 40. The first bars 30e1 of the shielding pattern 30e may be narrower than the bars of the lower overlay marking 40. Accordingly, the entirety of each first bar 30e1 of the shielding pattern 30e may overlap a respective bar of the lower overlay mark 40. Alternatively, the first bars 30e1 may be wider than the second bars 30e2. The second bars 30e2 may be and the bars of the lower overlay marking 40 may each be symmetrical about the same vertical plane. For example, the second bars 30e2 may be vertically aligned with the slits of the lower overlay marking 40. The pitch Pe of the first bars 30e1 may be the same as the pitch P2 of the bars of the lower overlay marking 40. Slits between the first bars 30e1 and the second bars 30e2 may be uniform.

The width-wise amount of the shielding pattern occupied by the bars may be different from that occupied by the slits in the examples shown in FIGS. 7A to 8B. In other words, the bars and the slits of the shielding pattern 30d and 30e may have different widths.

FIGS. 9A to 9F illustrate one example of a method of manufacturing a semiconductor device according to the inventive concepts.

Figure 9A:
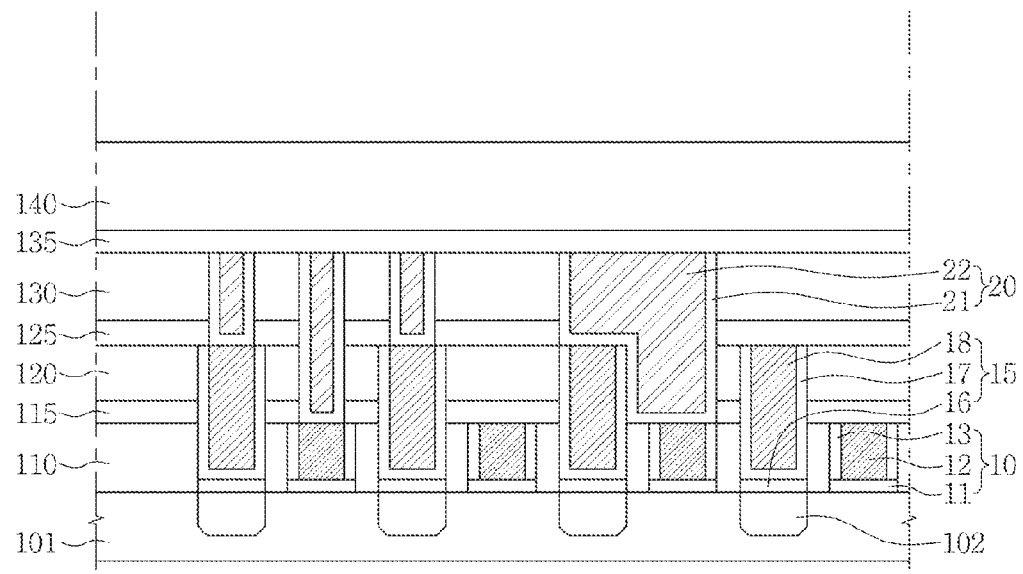
FIGS. 9A, 9B, 9C, 9D, 9E, and 9F together illustrate a method of forming a semiconductor device according to the inventive concepts and are each a longitudinal sectional view of the device during the course of its manufacture as taken in a direction corresponding to that of line I-I' of FIG. 1A.

Referring to FIG. 9A, the method may comprise forming a circuit pattern 10, 15, and 20 on a substrate 101.

The substrate 101 may comprise a fin active region. The substrate 101 may comprise source/drains 102 in the fin active region. The substrate 100 may comprise silicon (Si) or silicon oxide. For example, the substrate 100 may be a silicon wafer. The circuit pattern 10, 15, and 20 may comprise gates 10, contacts 15, and vias 20.

Each gate 10 may comprise a gate insulating layer 11, a gate electrode 12, and a gate spacer 13. The gate insulating layer 11 may be directly formed on the substrate 101. The gate insulating layer 11 may comprise an insulator such as silicon oxide or a metal oxide. The gate electrode 12 comprises a conductor such as a metal. The gate spacer 13 may be formed on side surfaces of the gate electrode 12. The gate spacer 13 may comprise silicon nitride or silicon oxide.

The method may further comprise forming a bottom interlayer insulating layer 110. The bottom interlayer insulating layer 110 may comprise silicon oxide such as tetraethyl orthosilicate (TEOS), and may cover sides of the gate pattern 10 and the contact pattern 15.

The method may comprise planarizing conductive and insulating layers to form the gate pattern 10 and the bottom interlayer insulating layer 110, and forming a first stopping insulating layer 115 and a first interlayer insulating layer 120. The first stopping insulating layer 115 may comprise silicon nitride.

Each contact 15 may comprise a contact silicide layer 16, a contact barrier layer 17, and a contact plug 18. The contact silicide layer 16 may be formed by forming a metal layer on the source/drains 102, and performing a silicidation process. The metal layer may comprise tungsten (W), titanium (Ti), nickel (Ni), cobalt (Co), or another metal. Accordingly, the contact silicide layer 16 may comprise tungsten silicide (WSi), titanium silicide (TiSi), nickel silicide (NiSi), cobalt silicide (CoSi), or another metal silicide.

The contact barrier layer 17 may comprise a metal nitride such as titanium nitride (TiN). The contact plug 18 may comprise a metal such as tungsten.

The forming of the contacts 15 may comprise forming contact holes which vertically pass through the first interlayer insulating layer 120, the first stopping insulating layer 115, and the bottom interlayer insulating layer 110 and expose the source/drains 102, forming a contact silicide layer 16 on the exposed source/drains 102, conformally forming a contact barrier layer 17 on the contact silicide layer 16 and in the contact holes, forming contact plugs 18 on the contact barrier layer 17 to fill the contact holes, and planarizing by performing a chemical mechanical polishing (CMP) process on upper surfaces of the first interlayer insulating layer 120, the contact barrier layer 17, and the contact plugs 18.

The method may further comprise forming a second stopping insulating layer 125 and a second interlayer insulating layer 130 on the contact pattern 15 and the first interlayer insulating layer 120. The second stopping insulating layer 125 may comprise silicon nitride, and the second interlayer insulating layer 130 may comprise silicon oxide such as TEOS.

Each via 20 may comprise a via barrier layer 21 and a via plug 22. The via barrier layer 21 may comprise titanium (Ti) or titanium nitride (TiN). The via plug 22 may comprise a metal such as copper (Cu) or tungsten (W).

The forming of the vias 20 may comprise forming via holes which vertically pass through the second interlayer insulating layer 130, the second stopping insulating layer 125, the first interlayer insulating layer 120, and the first stopping insulating layer 115, and expose upper surfaces of the contact pattern 15 and/or the gate pattern 10, conformally forming via barrier layers 21 in the via holes, forming via plugs 22 filling the via holes, and planarizing upper surfaces of the material filling the via holes and the second interlayer insulating layer 130.

The method may comprise forming a capping layer 135 and a lower interlayer insulating layer 140 on the vias 20 and the second interlayer insulating layer 130. The capping layer 135 may comprise silicon nitride (SiN), silicon carbonitride (SiCN), or silicon oxynitride (SiON). The lower interlayer insulating layer 140 may comprise silicon oxide such as TEOS or high density plasma oxide (HDP-oxide).

Figure 9B:
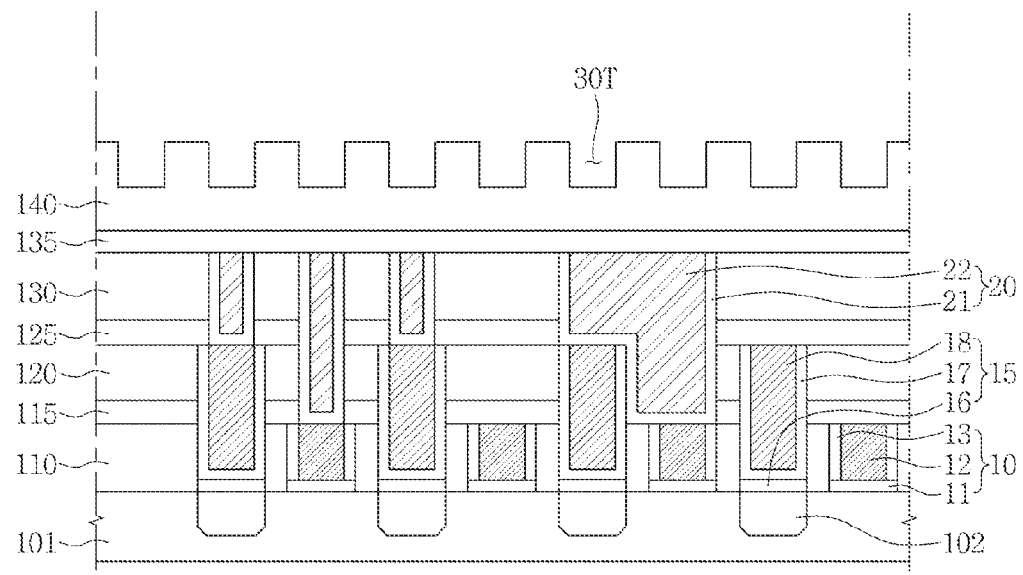

Referring to FIG. 9B, the method may comprise selectively etching the lower interlayer insulating layer 140 to form shielding trenches 30T in the lower interlayer insulating layer 140.

Figure 9C:
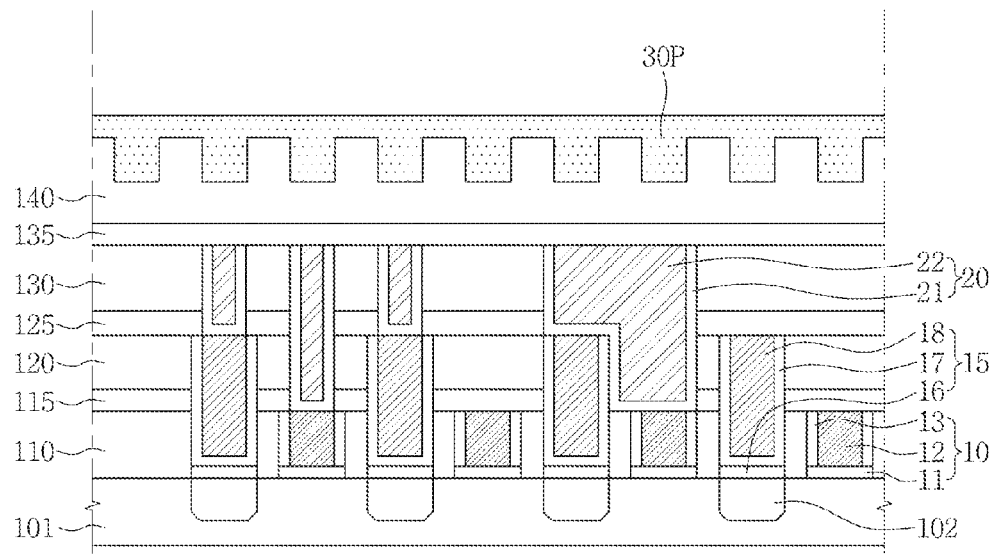

Referring to FIG. 9C, the method may comprise forming a shielding plate 30P by filling the shielding trenches 30T with a metal such as copper (Cu) or tungsten (W).

Figure 9D:
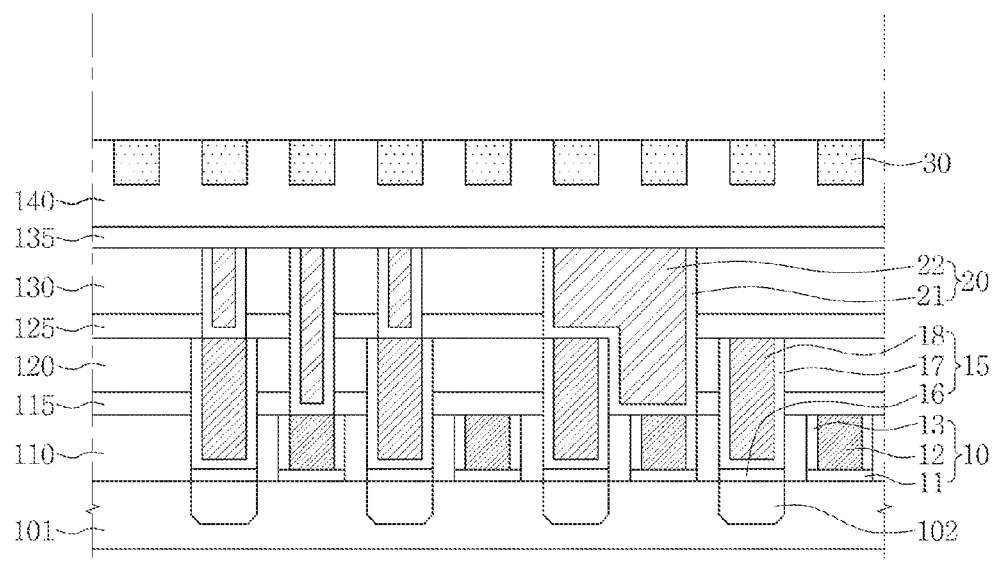

Referring to FIG. 9D, the method may comprise performing a planarization process, such as a CMP process, on an upper surface of the shielding plate 30P to form the shielding pattern 30. Thus, the shielding pattern 30 may selectively expose the lower interlayer insulating layer 140. Upper surfaces of the shielding pattern 30 and the lower interlayer insulating layer 140 may be co-planar.

Figure 9E:
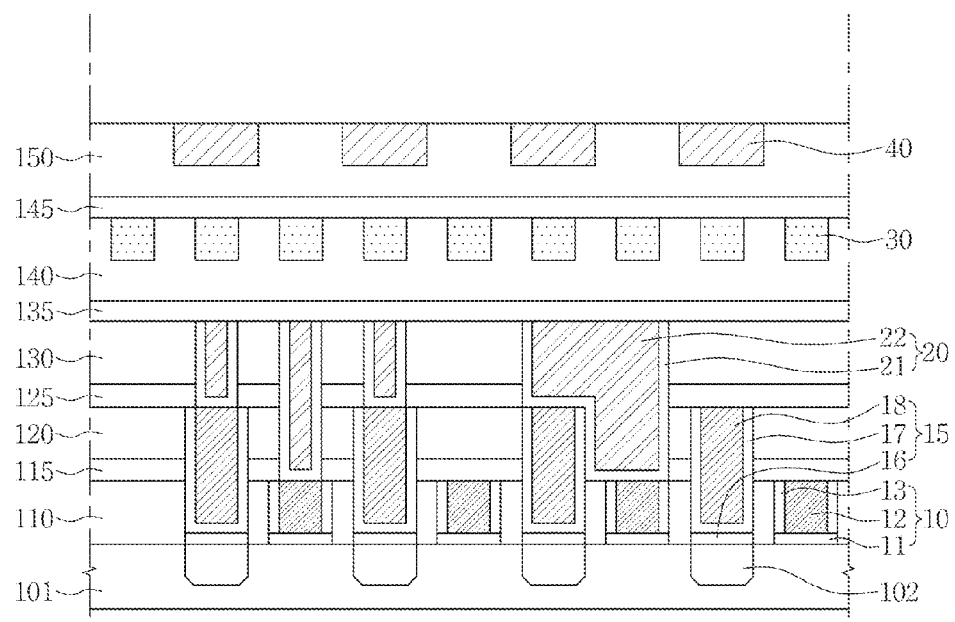

Referring to FIG. 9E, the method may comprise forming a lower stopping insulating layer 145 and an upper interlayer insulating layer 150 on the shielding pattern 30 and the lower interlayer insulating layer 140, and forming lower overlay marking 40 in the upper interlayer insulating layer 150. The lower overlay marking 40 may selectively expose an upper portion of the upper interlayer insulating layer 150. The lower stopping insulating layer 145 may comprise a more solid material, such as silicon nitride (SiN), silicon carbonitride (SiCN), or silicon oxynitride (SiON), than the lower interlayer insulating layer 140. The upper interlayer insulating layer 150 may comprise silicon oxide such as silicon dioxide ($SiO_2$). The lower overlay marking 40 may comprise a metal such as copper (Cu) or tungsten (W). According to an example of the inventive concepts, the lower overlay marking 40 may overlap the circuit pattern 10, 15, and 20. In other words, the lower overlay marking 40 may be formed in a chip region rather than in a scribe lane of a wafer.

Figure 9F:
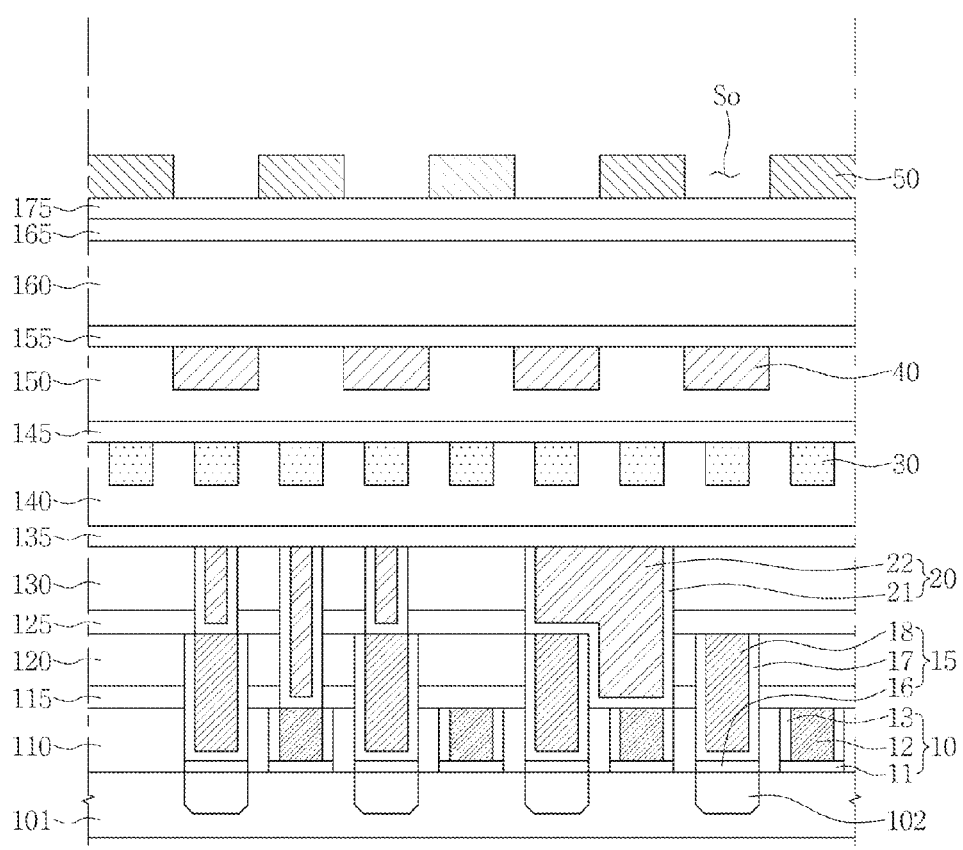

Referring to FIG. 9F, the method may comprise forming an upper stopping insulating layer 155, a sacrificial layer 160, and upper overlay marking 50 on the lower overlay marking 40 and the upper interlayer insulating layer 150. The method may further comprise forming a sacrificial capping layer 165 and an anti-reflective layer 175 on the sacrificial layer 160. The upper stopping insulating layer 155 may comprise a more solid material, such as silicon nitride (SiN), silicon carbonitride (SiCN), or silicon oxynitride (SiON), than the upper interlayer insulating layer 150. The sacrificial layer 160 may have an etch selectivity with respect to silicon oxide and silicon nitride. For example, the sacrificial layer 160 may comprise silicon oxide containing carbon such as a spin-on-hardmask (SOH). The sacrificial capping layer 165 may have an etch selectivity with respect to the sacrificial layer 160. For example, the sacrificial capping layer 165 may comprise any one of silicon nitride, silicon oxynitride, and silicon carbonitride. The anti-reflective layer 175 may comprise an organic or inorganic polymer. The upper overlay marking 50 may have a plurality of parallel overlay slits So. The overlay slits So are vertically aligned with bars of the lower overlay marking 40, respectively. The upper overlay marking 50 may comprise a photoresist.

According to one aspect of the inventive concepts, the shielding pattern 30 disposed under the lower overlay marking 40 can block light reflected from the circuit pattern 10, 15, and 20. Therefore, the accuracy of an overlay process can be improved.

According to another aspect of the inventive concepts, the shielding pattern 30a to 30e may be used as a polishing stopping layer in a CMP process. Therefore, the lower overlay marking 40 may be formed in a chip region rather than in a scribe lane. Accordingly, the number of chips per wafer may be increased according to this aspect of the inventive concept, i.e., the productivity of the manufacturing process can be increased.

According to still another aspect of the inventive concepts, a plurality of overlay inspection processes may be performed at the same location by virtue of the lower overlay marking 40. Therefore, the accuracy of overlay inspection can be improved.

Figure 10:
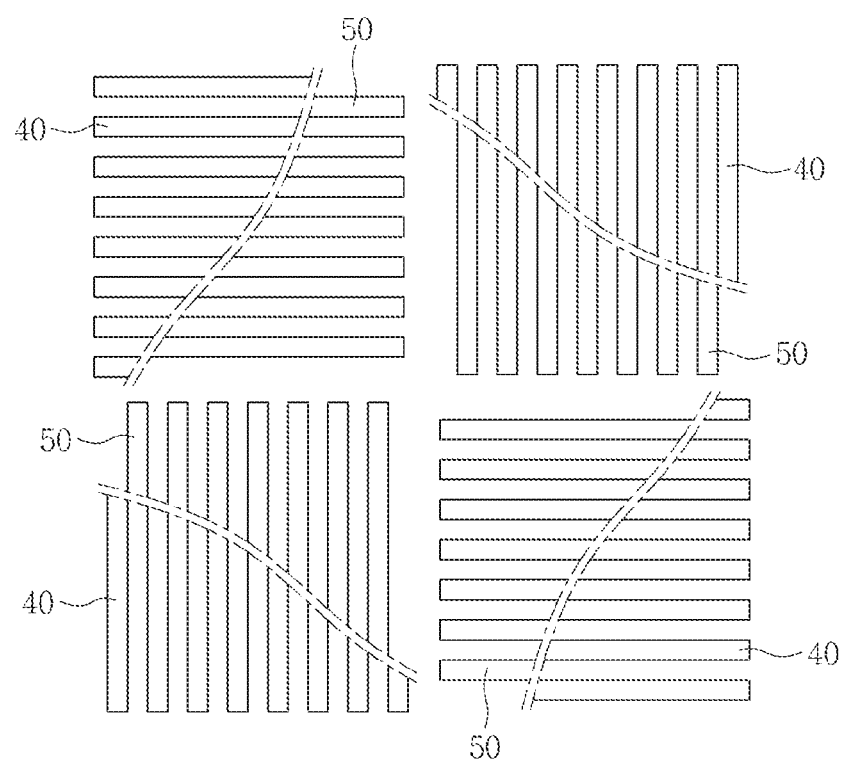
FIG. 10 is a layout diagram illustrating an overlapping lower overlay marking and upper overlay marking of a semiconductor device according to the inventive concepts.

FIG. 10 illustrates a layout of a lower overlay marking and upper overlay marking of a semiconductor device, such as that shown in FIG. 9E, according to the inventive concepts.

Referring to FIG. 10, each of the lower overlay marking 40 and the upper overlay marking 50 may comprise a plurality of sets of parallel bars and slits extending in four directions within four quadrants of a square region, respectively. The bars are oriented such that each of the lower overlay marking 40 and the upper overlay marking 50 has the shape of a pinwheel. The bars of the lower overlay marking 40 and the bars of the upper overlay marking 50 are laterally offset relative to one another. In this example, the bars of the lower overlay marking 40 are vertically aligned with the slits of the upper overlay marking 50, and the slits of the lower overlay marking 40 are vertically aligned with the bars of the upper overlay marking 50. The bars of the lower overlay marking 40 and the bars of the upper overlay marking 50 may have the same pitch.

Also, in this example, as is shown in FIG. 9E, a shielding pattern 30 is disposed at a level beneath that of the upper overlay marking 50 and the lower overlay marking 40 in the device. Therefore, the overlay inspection can be conducted very accurately, i.e., the number of overlay inspection errors can be minimized even though layers of a circuit pattern are disposed under the upper overlay marking 50 and lower overlay marking 40.

Figure 11A:
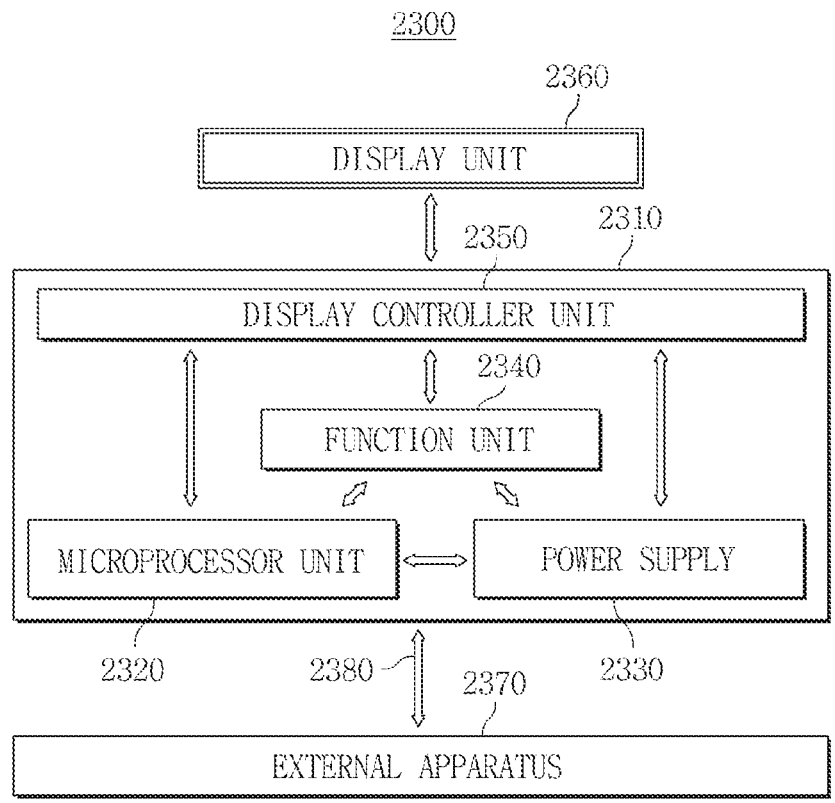
FIGS. 11A and 11B are block diagrams of examples of electronic systems according to the inventive concepts.
Figure 11B:
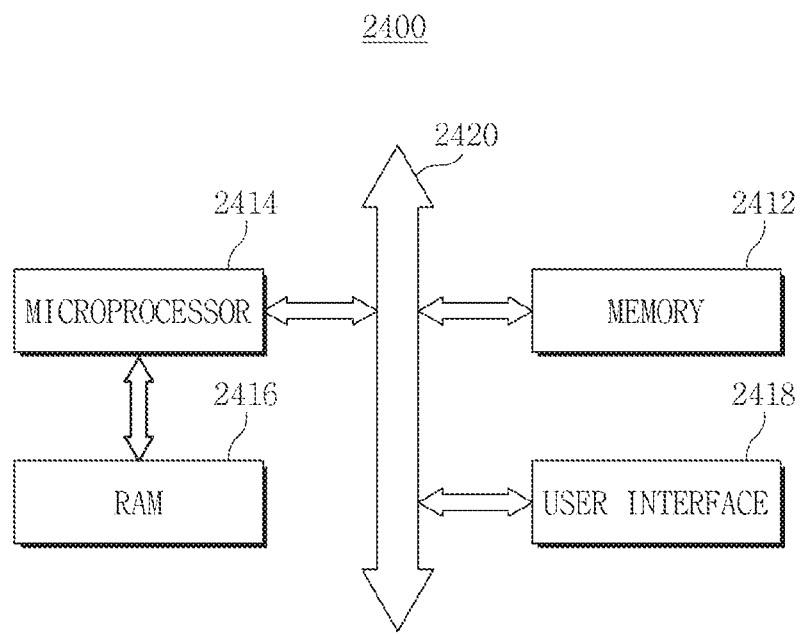

FIGS. 11A and 11B are block diagrams illustrating electronic systems according to the inventive concepts.

Referring to FIG. 11A, one example of an electronic system 2300 according to the inventive concepts may comprise a body 2310, a display unit 2360, and an external apparatus 2370. The body 2310 may comprise a microprocessor unit 2320, a power supply 2330, a function unit 2340, and/or a display control unit 2350. The body 2310 may comprise a system board or motherboard having printed circuit board (PCB) or the like, and/or a case. The microprocessor unit 2320, the power supply 2330, the function unit 2340, and the display control unit 2350 may be installed or disposed on an upper surface or inside of the body 2310. The display unit 2360 may be disposed on the upper surface of the body 2310 or inside or outside of the body 2310. The display unit 2360 may display an image processed by the display control unit 2350. For example, the display unit 2360 may comprise a liquid crystal display (LCD), active matrix organic light emitting diodes (AMOLED), or various display panels. The display unit 2360 may comprise a touch screen. Accordingly, the display unit 2360 may have input/output functions. The power supply 2330 may supply a current or voltage to the microprocessor unit 2320, the function unit 2340, the display control unit 2350, etc. The power supply 2330 may comprise a chargeable battery, a socket for a dry cell, or a voltage/current converter. The microprocessor unit 2320 may receive a voltage from the power supply 2330 and control the function unit 2340 and the display unit 2360. For example, the microprocessor unit 2320 may comprise a central processing unit (CPU) or application processor (AP). The function unit 2340 may comprise a touch pad, a touch screen, a volatile/non-volatile memory, a memory card controller, a camera, a lighting, an audio and video replay processor, a radio transceiver antenna, a speaker, a microphone, a Universal Serial BUS (USB) port, and/or a unit having various functions. The microprocessor unit 2320 or the function unit 2340 may comprise any of the semiconductor devices described above according to the inventive concepts.

Referring to FIG. 11B, an example of an electronic system 2400 according to the inventive concepts may comprise a microprocessor 2414, a memory system 2412, and a user interface 2418 which perform data communication through a bus 2420. The microprocessor 2414 may comprise a CPU or AP. The electronic system 2400 may further comprise a RAM 2416 in direct communication with the microprocessor 2414. The microprocessor 2414 and/or the RAM 2416 may be assembled in a single package. The user interface 2418 may be used for data input to the electronic system 2400, or data output from the electronic system 2400. For example, the user interface 2418 may comprise a touch pad, a touch screen, a keyboard, a mouse, a scanner, a voice detector, a cathode ray tube (CRT) monitor, an LCD, an AMOLED, a PDP plasma display panel, a printer, a lighting, or various input/output devices. The memory system 2412 may store operating code of the microprocessor 2414, data processed by the microprocessor 2414, or external input data. The memory system 2412 may comprise a memory controller, a hard disk, or a solid state drive (SSD). The microprocessor 2414, the RAM 2416, and/or the memory system 2412 may comprise any of the semiconductor devices described above according to the inventive concepts.

As described above, a semiconductor device according to one aspect of the inventive concepts may have a shielding pattern interposed between layers of a circuit of the device and an overlay marking. Therefore, light used in an overlay inspection process and reflected from the circuit pattern under the shielding pattern will be blocked, whereby the accuracy of the overlay inspection process is ensured.

A semiconductor device according to another aspect of the inventive concept may have an overlay marking whose individual features are located at the same level across the substrate and comprise parallel line features. That is, there is no step difference in the overlay marking. Therefore, the accuracy of overlay inspection can be ensured.

Also, a semiconductor device according to another aspect of the inventive concepts has overlay marking confined to a chip region. Therefore, the area of a scribe lane bordering the chip region can be minimized.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. A semiconductor device comprising:
a substrate and a circuit pattern on the substrate;
a shielding pattern extending over the circuit pattern and comprising parallel bars of material such that the shielding pattern also defines a plurality of openings between the bars; and
lower overlay marking disposed on the shielding pattern and comprising parallel bars of material, and the lower overlay marking having a plurality of slits defined by and between the bars thereof, and
wherein the pitch of the bars of the shielding pattern is less than the pitch of the bars of the lower overlay marking.

2. The semiconductor device of claim 1, wherein the bars of the shielding pattern extend parallel to the bars of the lower overlay marking.

3. The semiconductor device of claim 2, wherein the respective bars of the shielding pattern are symmetrical with respect to a vertical plane perpendicular to an upper surface of the substrate, and the respective the bars of the lower overlay marking and the slits of the lower overlay marking are also symmetrical with respect to said vertical plane.

4. The semiconductor device of claim 3, wherein first ones of the bars of the shielding pattern are vertically aligned with centers of the bars of the lower overlay marking, respectively, and second ones of the bars of the shielding pattern are vertically aligned with centers of the slits of the lower overlay marking, respectively.

5. The semiconductor device of claim 3, wherein the pitch of the bars of the shielding pattern is 1/n times the pitch of the bars of the lower overlay marking, and n is an integer greater than 1.

6. The semiconductor device of claim 1, wherein a duty cycle of the bars of the shielding pattern is 50% within one pitch of the bars.

7. The semiconductor device of claim 1, wherein the bars of the shielding pattern comprise first bars and second bars narrower than the first bars.

8. The semiconductor device of claim 7, wherein the first bars and the second bars are alternately disposed in a direction perpendicular to their longitudinal direction.

9. The semiconductor device of claim 7, wherein the first and second bars define slits therebetween, and the slits between the first bars and the second bars are uniform.

10. The semiconductor device of claim 1, wherein the circuit pattern comprises at least one gate and at least one contact.

11. A semiconductor device, comprising:
a substrate and a circuit pattern on the substrate;
a shielding pattern disposed on the circuit pattern and comprising a plurality of parallel bars of material; and
lower overlay marking disposed on the shielding pattern and comprising a plurality of parallel bars of material, and the lower overlay marking having a plurality of slits defined by and between the bars thereof, and
wherein some of the bars of the shielding pattern overlap the slits of the lower overlay marking as viewed in plan.

12. The semiconductor device of claim 11, wherein the slits of the bars of the lower overlay marking overlap some of the slits of the bars of the shielding pattern as viewed in plan.

13. The semiconductor device of claim 11, wherein the bars of the shielding pattern comprise first bars extending parallel to the bars of the lower overlay marking.

14. The semiconductor device of claim 13, wherein the bars of the shielding pattern comprise second bars extending orthogonally to the bars of the lower overlay marking.

15. The semiconductor device of claim 11, wherein the shielding pattern is disposed within four quadrants of a square region and comprises a plurality of sets of parallel bars defining parallel slits therebetween, each of the sets of parallel bars is disposed in a respective one of the four quadrants, and the orientation of each of the sets of parallel bars of the shielding pattern being rotated by an angular increment of 90 degrees relative to the orientation of the set of parallel bars adjacent thereto in a clockwise direction in the square.

16. A semiconductor device comprising:
a substrate and a circuit pattern comprising electrically conductive features on the substrate;
a light shielding pattern comprising bars in the device, the bars extending over the circuit pattern; and
overlay marking dedicated for use in an overlay inspection process, the overlay marking consisting of bars of material, and the overlay marking having a plurality of slits defined by and between the bars thereof, and
wherein the light shielding pattern is interposed between the overlay marking and the circuit pattern.

17. The semiconductor device of claim 16, wherein in at least one section of a region of the device in which the circuit pattern is located, the bars of the light shielding pattern extend longitudinally in a first direction, and the bars of the overlay marking extend longitudinally in the first direction so as to run parallel to the bars of the light shielding pattern.

18. The semiconductor device of claim 16, wherein in at least one section of a region of the device in which the circuit pattern is located, the bars of the light shielding pattern extend longitudinally in a first direction, and the bars of the overlay marking extend longitudinally in a second direction orthogonal to the first direction.

19. The semiconductor device of claim 16, wherein the light shielding pattern has the form of a grid.

20. The semiconductor device of claim 15, further comprising an upper overlay marking spaced above and extending over the lower overlay marking, the upper overlay marking comprising a plurality of parallel bars of material, and the upper overlay marking having a plurality of slits defined by and between the bars thereof,
wherein in at least one section of a region of the device in which the circuit pattern is located, the bars of the upper layer of overlay marking are parallel to and laterally offset relative to the bars of the lower layer of overlay marking.

* * * * *